United States Patent [19]

Stockero et al.

[11] Patent Number: 4,894,015

[45] Date of Patent: Jan. 16, 1990

[54] FLEXIBLE CIRCUIT INTERCONNECTOR AND METHOD OF ASSEMBLY THEREOF

[75] Inventors: David M. Stockero; Bruce A. Myers; Robert H. Obremski, all of Kokomo, Ind.

[73] Assignee: Delco Electronics Corporation, Kokomo, Ind.

[21] Appl. No.: 238,943

[22] Filed: Aug. 31, 1988

[51] Int. Cl.[4] .............................................. H01R 9/09
[52] U.S. Cl. ...................................... 439/67; 29/842; 29/844; 439/493
[58] Field of Search ...................... 439/67, 79, 80, 493, 439/629; 29/842, 844, 845

[56] References Cited

U.S. PATENT DOCUMENTS

| | | | |
|---|---|---|---|
| 4,157,612 | 6/1979 | Rainal | 439/493 |
| 4,489,999 | 12/1984 | Miniet | 439/67 |
| 4,491,376 | 1/1985 | Gladd et al. | 399/9 E |
| 4,552,420 | 11/1985 | Eigenbrode | 439/67 |
| 4,771,366 | 9/1988 | Blake et al. | 439/67 |

OTHER PUBLICATIONS

"Fine Line Flex Circuitry Offers Serious Challenges" pp. 54–58, *Electronic Packaging and Production*, Jun. 1985.
Delco Electronic Drawing DK079033, Sheet 1.
Two 8½×11 Drawings dated 6/10/86, marked Exhibit 1 and 2.

*Primary Examiner*—P. Austin Bradley
*Attorney, Agent, or Firm*—Francis J. Fodale

[57] ABSTRACT

A flexible circuit interconnector connects a circuit board having a ceramic substrate to pin connectors at the connector end of a circuit board connector housing. The interconnect has a thin flexible sheet of polymeric, electrical insulating material with a mating end and a connector end. The mating end includes a plurality of spaced holes therethrough for receiving tail ends of the pin connectors. A plurality of electrically conductive runners provided on one side of the flexible sheet electrically connect the pin connectors to printed conductors on the ceramic substrate. The thin flexible sheet has a viewing slot at the connector end thereof which is bridged by the runners and it has a bend which accommodates differential thermal expansion in the circuit board and connector. The method of assembly includes prebending the interconnect to accommodate thermal expansion between the connector housing and the ceramic substrate; placing the slot over the ceramic substrate to view the conductor print pattern; aligning each of the runners with one conductor in the print pattern; one step soldering each of the runners to separate conductors in the print pattern to complete electrical circuits; cleaning flux from the soldered parts and thereafter connecting the mating end of the flexible circuit interconnector to the pin connectors of the circuit board connector housing.

10 Claims, 3 Drawing Sheets

FLEXIBLE CIRCUIT INTERCONNECTOR AND METHOD OF ASSEMBLY THEREOF

This invention relates to flexible circuit interconnectors for hybrid circuits and more particularly to flexible circuit interconnectors for accommodating differential thermal expansion between circuit board and connector devices in such hybrid circuits and to a method for assembly such flexible circuit interconnectors in hybrid circuits.

BACKGROUND OF THE INVENTION

Various arrangements are used to connect multiple pin connectors to printed conductors on circuit boards having ceramic substrates. The printed conductors are mated to welding or bonding pads on the ceramic substrate. The pads are each electrically connected to the connector terminals by various individual conductor means including nickel wire pigtails; offset metal frame conductors and aluminum or copper wiring.

Each such individual conductor has one end thereof welded or otherwise bonded to one connector terminal. When the connector is wired, its individual electrical conductors are each bonded to one of the metal pads on the ceramic substrate. The operation for connecting the electrical conductors to the metal pads is carried out one wire at a time.

One problem with this arrangement is that each metal pad measures 80×80 mils to 80×140 mils. The combined surface area of all such pads requires use of larger area ceramic substrates to accommodate both the metal pads and the population of discrete circuit components for carrying out a desired circuit operation or control function.

Another problem with such individual electrical conductors is that wire or metal frame elements are not easily connected to standard pin type connectors. The wires or metal frames also require multiple step (one at a time) connection to the metal pads.

U.S. Pat. No. 4,491,376 discloses an arrangement in which a pin type circuit board connector has a plurality of pin type connectors each of which is directly connected through spaced holes in a printed circuit board where they are soldered in place to provide an electrical interface. In the '376 arrangement a plastic housing of the connector and the metal pins expand at different rates. In order to accommodate such differential thermal expansion the pin connectors are arranged with respect to the housing walls to flex horizontally and vertically to prevent stress build up at the solder connections. This approach also requires pin holes in the substrate of the printed circuit board. Such pin holes are difficult to form in brittle ceramic substrate material. Another problem is that in order to accommodate differential thermal expansion the housing for the connector requires formation of special cavities and slip details.

SUMMARY OF THE INVENTION

Accordingly, an object of the present invention is to provide a flexible interconnector for electrically connecting hybrid circuit components including a standard circuit board connector having standard pin connectors and a printed circuit board having printed conductors with narrow spacing therebetween and to do so by a flexible circuit interconnector which provides strain relief as the hybrid circuit is subject to different temperature levels during the operation thereof.

Another object of the present invention is to provide a flexible circuit interconnector which will eliminate metal pads for connecting such printed conductors on a ceramic substrate and thereby provide a reduction in the area of the ceramic substrate.

Another object of the present invention is to provide an improved method for assembling a connector having a mating end and a connector end with a plurality of round connector pins to print conductors on a circuit board including a ceramic substrate which method includes the steps of providing a thin flexible sheet of polymeric material having a mating end with holes formed therein to receive the connector pins and having a connector end with a viewing slot bridged by electrically conductive runners to define a visual reference; prebending the sheet to have a bend therein for accommodating thermal expansion; placing the viewing slot over the ceramic substrate and aligning the runners by orienting bridging runners colinearly of the ends of a plurality of parallel printed conductors; single step soldering the aligned runners and printed conductors and thereafter cleaning flux from the soldered parts; and inserting the connectors pins through mating holes in the prebent sheet and soldering or electrically bonding the pins to the runners to complete the electrical connections from the connector to discrete components on the circuit board.

A further feature of the present invention is to provide an interconnector device for electrically connecting hybrid circuit components including a connector housing having pin connectors with tail ends thereon and a circuit board having a printed conductor pattern thereon and wherein the pin connectors and printed conductor pattern are connected by the interconnector device along one side of the circuit board by means including a thin flexible sheet of dielectric polymeric material having a mating end with a plurality of holes directed therethrough arranged at spacings corresponding to the spacing of pin connectors on a connector housing and wherein each of the plurality of holes is adapted to receive the tail end of one of the plurality of pin connectors on the connector housing and wherein a plurality of electrically conductive metallic runners on one side of said thin sheet are deformable to maintain a bend in the sheet when it is prebent to form a shape to accommodate differential thermal expansion between hybrid circuit components. Each of such runners has a first end located at one of said plurality of holes and a second end thereof extending to a connector end of the flexible sheet for electrical connection to a printed conductor pattern on the circuit board.

Another feature of the present invention is to provide a flexible circuit interconnector as set forth in the preceding paragraph wherein each of the tail ends is electrically connected to one of the electrically conductive runners at one end thereof and wherein the opposite end of each electrically conductive runner is adapted to overlie an end of a conductor path printed on a circuit board for electrical connection thereto; and wherein the thin flexible sheet has a length which provides a bend between the mating end and the connector end when the thin flexible sheet is interconnected between the connector housing and the circuit board, which bend is configured to accommodate differential thermal expansion between the interconnected connector housing and circuit board assemblies.

Other objects and features of the invention will become apparent to those skilled in the art as the disclosure is made in the following detailed description of a preferred embodiment of the device and a preferred embodiment of the method of assembly of the device as illustrated in the accompanying sheets of drawing in which:

DETAILED DESCRIPTION OF THE DRAWINGS

DETAILED DESCRIPTION OF THE SPECIFICATION

Figure 1:
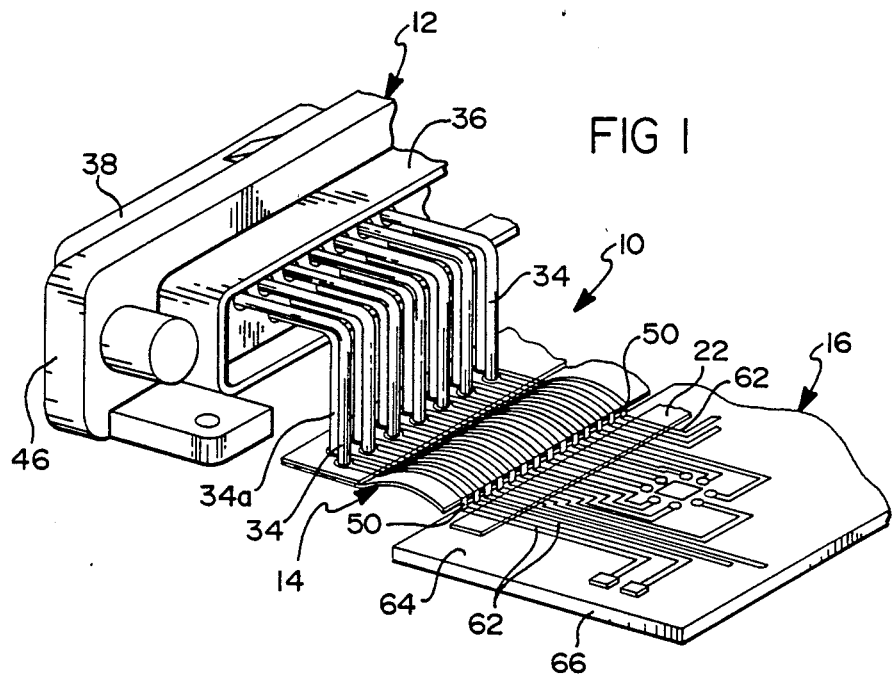
FIG. 1 is a perspective view of the flexible circuit interconnector of the present invention.
Figure 2:
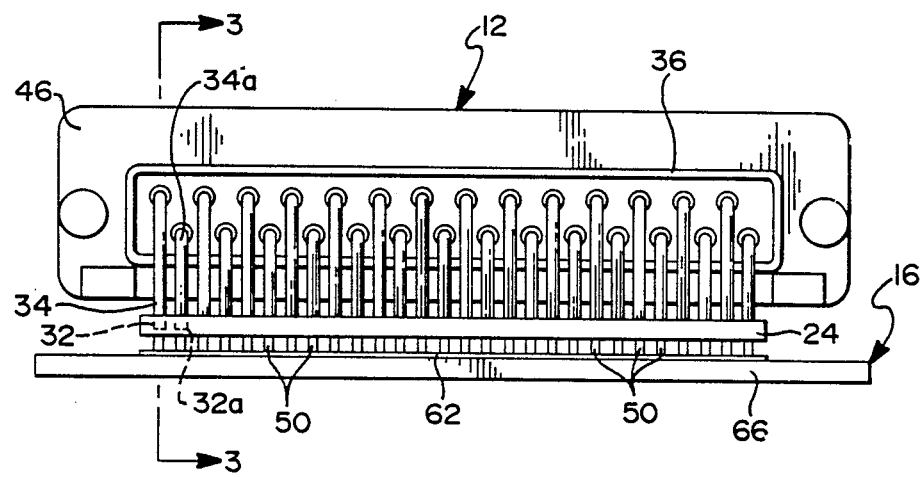
FIG. 2 is a frontal view of the hybrid circuit shown in FIG. 2.
Figure 3:
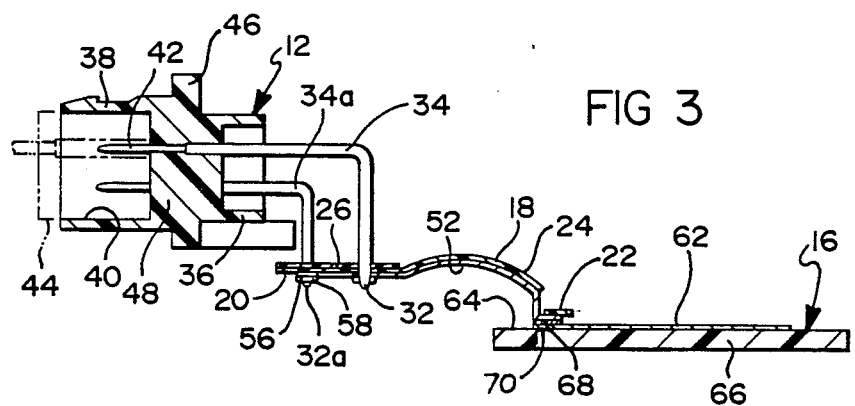
FIG. 3 is an enlarged sectional view taken along the line 3—3 of FIG. 2 looking in the direction of the arrows.

Referring now to the drawings, a hybrid circuit 10 is illustrated in FIGS. 1-3 which includes a standard circuit board type multiple pin type connector 12 electrically connected by a flexible circuit interconnector 14 to a ceramic type circuit board 16.

In accordance with the present invention the flexible circuit interconnector 14 includes a thin sheet 18 of electrically insulating flexible polymeric material such as Kapton, a polyimide manufactured by Dupont Company. The sheet has a thickness in the order of 2 mils and includes a mating end 20 and a connector end 22. The sheet 18 is freely bendable between the ends to form a convolution or bend 24 between the ends 20, 22 for accommodating differential thermal expansion between the connector 12 and the ceramic type circuit board 16 when the flexible circuit interconnector is assembled therewith.

More specifically, the thin polymeric sheet 18 includes a stiffener segment 26 at the mating end 20 thereof which stiffens the flexible circuit interconnector 14 at a plug connector interface therein defined by a plurality of spaced holes 30 each of which is adapted to receive a tail end 32, 32a of a round connector pin 34, 34a directed from the connector end 36 of the connector 12.

In the illustration, the connector 12 is shown as having a mating end 38 with a plug socket 40 therein with a plurality of pins 42 adapted to be electrically connected to a suitable plug-in connector 44 shown in phantom in FIG. 3. The connector end 36 has a flange 46 for mounting the housing 48 of the connector 12 to a support member (not shown). The housing 48 is a suitable dielectric material and the plurality of connector pins 34, 34a are made from a suitable material such as tin plated brass although other suitable conductive materials may be used.

One feature of the flexible circuit interconnector 14 is that the holes 30 therein and the stiffener segment 26 combine to provide a good mechanical and electrical connection to the tail ends 32, 32a of standard round type pins. In order to accomplish this desirable result, the flexible circuit interconnector has a plurality of spaced electrically conductive runners 50 formed on the underside 52 of the thin polymeric sheet 18. Each of the runners 50 has a circular head portion 54 formed around one of the mating holes 30 so as to form a surface 56 to receive a solder or conductive adhesive joint 58 which surrounds each tail end 32, 32a as it extends through a hole 30 to the underside 52 as best seen in FIG. 3. Each joint 58 mechanically bonds the tail ends 32, 32a to the polymeric sheet 18 as well as providing a sound, reliable electrical connection between each tail end 32, 32a and one of the electrically conductive runners 50.

Figure 4:
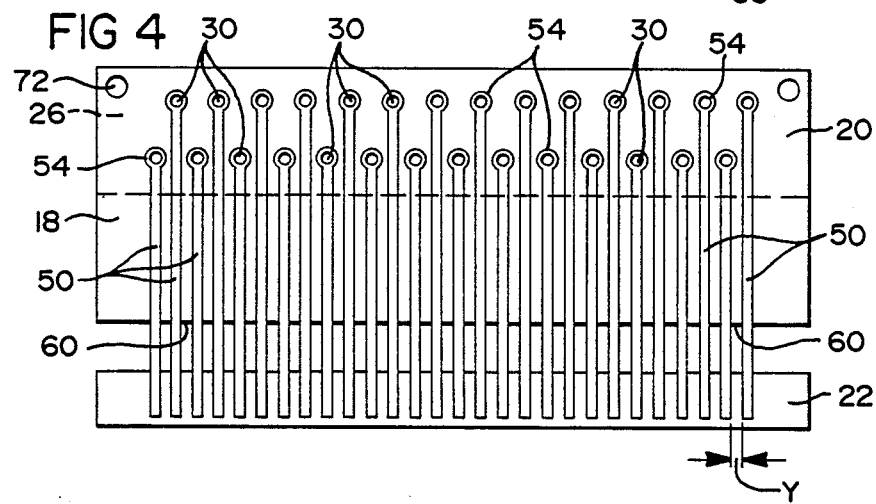
FIG. 4 is a bottom elevational view of the flexible circuit interconnector prior to assembly in the hybrid circuit of FIG. 3.

Each of the electrically conductive runners 50 is directed across the underside 52 of the thin polymeric sheet 18 and is bonded thereto by suitable means such as double backed adhesive. Each runner 50 has a segment 50a thereon which extends across a viewing slot or window 60 provided at the connector end 22 of the sheet 18 as best seen in FIG. 4. The runner segment 50a has side edges 50b, 50c which serve as a reference for aligning each of the runner ends 50d colinearly of a printed conductor 62 formed on the exposed surface 64 of a ceramic substrate 66 of the ceramic type circuit board 16. In FIG. 1 a plurality of such printed conductors 62 are illustratively shown as a printed conductor pattern for completing electrical circuits between individual discrete components and devices found in populated circuits, best shown in FIG. 1, found on such circuit boards. While the architecture of such populated circuits can take many forms, for purposes of the present invention it is only necessary to understand that the flexible circuit interconnector 14 serves to provide a good mechanical connection and electrical path for facilitating attachment of hybrid circuit components while improving the electrical interfaces therebetween.

Figure 5:
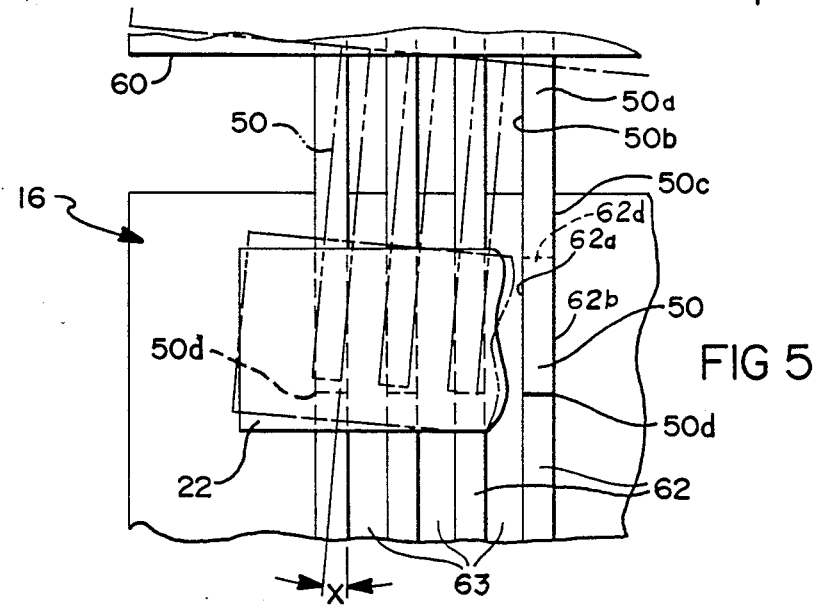
FIG. 5 is an enlarged fragmentary elevational view showing the interface between runners and conductor prints at the connector end of the flexible circuit interconnector.

The referenced alignment of each of the runner segments 50a is shown in the fragmentary view of FIG. 5 as having the edges 50b, 50c positioned in alignment with the edges 62a and 62b of one of the printed conductors 62. The viewing slot 60 is shown in phantom in FIG. 5 to illustrate how the connector end 22 of the sheet 18 is angularly manipulated until a desired colinear alignment is visually observed through the slot 60 by angularly adjusting the segments 50a through correction angles X until alignment is achieved.

The runners 50 are selected from a material which is conductive, e.g. copper, and of a thickness which will allow each of the parallel runners 50 to easily flex with the sheet 18 to conform to the shape of the bend or convolution 24 in the assembled flexible circuit interconnector 14 which is required to provide strain relief during operation of the hybrid circuit in different temperature environments. The runners 50, once bent, hold the shape of the bend 24 as the flexible interconnector 14 has the mating end 20 and connector end 22 connected respectively to the connector 12 and the circuit board 14.

In order to establish a desired accommodation of differential thermal expansion between the various parts of the hybrid circuit 10, a stress analysis is conducted to determine the amount of accommodation required for different components, materials and different shapes. When subjected to high temperature operation, the thermoplastic material may expand more than metallic conductor pins and a metal support for the ceramic substrate may expand less than plastic. The bend 24 is shaped to accommodate such differences.

Such accommodation of differential thermal expansion relieves stress on the solder joints 58 and the solder connections between the runners 50 and printed conductors 62 thereby to increase the life and the reliability of the electric connections between the connector pins 34, 34a and the printed circuit board.

One feature of the configuration of the runners 50 is the provision of a fine pitch, e.g., 30 mil line spaces as shown by dimension Y in FIG. 4. This allows the flexible circuit interconnector 14 to be directly electrically connected to a number of equally fine pitch printed conductors 62 on the ceramic substrate 66. Such connections eliminate metal pads. Consequently, the ceramic substrates can accommodate more discrete elements of a populated circuit within reduced dimensional confines.

The direct connection of the runners 50 at the at the runner ends 50d is made by a layer 68 of solder on each runner segment 50a exposed at the slot 60. The solder is a 60/40 material which, when melted, selectively wets only the runners 50 and the printed conductors 62 where they overlie the ends 62d of the printed conductors 62 (FIG. 5). The surface tension of the solder at the surface 64 of ceramic substrate 66 prevents flow of solder across gaps 63 between each printed conductor 62. A one step solder process provides multiple interconnects between the connector end 22 of the flexible circuit interconnector 18 and the printed conductors 62. The one step process includes placing the flexible sheet 18 on the ceramic substrate 66 which is heated. The initial heating is supplemented by directing hot gas or other suitable source of heat through the window 60 until the solder layer 68 melts. Suitable flux material is applied to the ceramic substrate 66 across the printed conductors 62 to prevent oxidation of the solder joint at points 70. The solder layers 68 are made from a silver/copper material, e.g., 60/40, 63/37, solder which will melt and cool to form a sound, reliable electrical connection without flowing across fine pitch gaps 63 between each of the conductor prints 62. The flux is easily cleaned from the circuit 10 once the solder connection has solidified.

Figure 6:
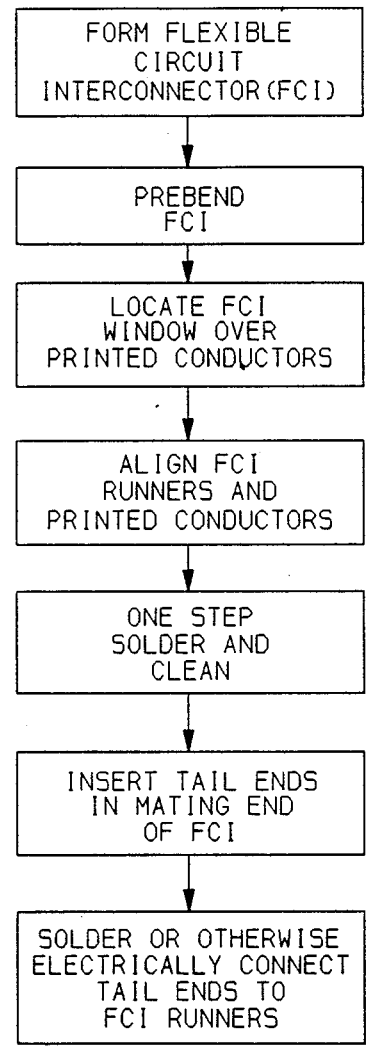
FIG. 6 is a chart of the steps of the method of assembly of the invention.

As shown in the chart of FIG. 6, another feature of the present invention is to provide an improved method of assembling a hybrid circuit. The method includes the steps of first providing a flexible hybrid circuit interconnector of the type discussed above and dimensioned to accommodate differential thermal expansion in an assembled hybrid circuit.

The cycle of assembly operation includes prebending the flexible circuit interconnector 14 between the mating end 20 thereof and the connector end 22 thereof.

The slot at the connector end of the prebent flexible circuit connector 14 is placed over the printed conductors on the ceramic substrate. Then the runners are aligned with the printed conductors on a ceramic substrate by relatively angularly adjusting the substrate and flexible circuit connector until the runners are colinear of the printed conductors. In one method, the prebent flexible circuit connector is placed over the substrate 66 and initially roughly aligned by die pins (not shown) which loosely fit in guide holes 72 at the sides of the sheet 18.

The connector end 22 is soldered to the printed conductors 62. Flux material is cleaned from the interconnector 14 and circuit board 16. The connector 12 is then connected to the cleaned substrate 66 and prebent flexible circuit connector 14 by inserting the tail ends 32, 32a of the connector pins 34, 34a completely through holes 30 in the flexible circuit connector 14 at the hollow conductor rings 54.

The inserted tail ends are then soldered or electrically adhered to the hollow conductor rings.

We wish it to be understood that we do not desire to be limited to the exact details of construction or method of assembly shown and described, for obvious modifications will occur to a person skilled in the art.

What is claimed is:

1. An interconnect assembly for electrically connecting a connector housing having pin connectors with tail ends thereon and a circuit board having a printed conductor pattern thereon and wherein the pin connectors and printed conductor patterns are interconnectible along one side of the circuit board at a fine pitch spacing therebetween the interconnect assembly comprising:

a thin flexible sheet of dielectric polymeric material having a mating end and a connector end;

means defining a plurality of holes directed through said thin sheet of flexible dielectric polymeric material along the mating edge thereof arranged at spacings corresponding to the fine pitch spacing of pin connectors on a connector housing and each of the plurality of holes adapted to receive the tail end of one of the plurality of pin connectors on the connector housing;

means defining a plurality of electrically conductive runners on one side of said flexible sheet, each of said electrically conductive runners having a thickness which permits bending thereof as said thin sheet is bent and each of said runners having a first end located at one of said plurality of holes and the other end thereof extending adjacent the connector end of said thin flexible sheet;

means for electrically connecting each of said tail ends to one of said electrically conductive runners at one end thereof and wherein the opposite end of each of said electrically conductive runners is adapted to overlie an end of a printed conductor path printed on a circuit board for electrical connection thereto;

said thin flexible sheet having a bent portion between said mating end and said connector end when said thin flexible sheet interconnected to said tail ends and the circuit board; said bent portion having a self holding shape which accommodates differential thermal expansion between the interconnected connector housing and circuit board; and said thin flexible sheet having a thickness in the order of 2 mils and including means on the mating end thereof to strengthen the sheet at the points thereon having said holes formed therethrough.

2. In the flexible circuit interconnect assembly of claim 1, said conductive runners being made of deformable metal which, when bent, serves to maintain the shape of said bend.

3. In the flexible circuit interconnect assembly of claim 1,
said thin flexible sheet including window means formed therein between the mating end and the connector end, and means within said window to reference said electrically conductive runners colinearly with respect to said printed conductors; and
said conductive runners being made of deformable metal which, when bent, serves to maintain the shape of said bend.

4. In the flexible circuit interconnect assembly of claim 1,
said thin flexible sheet including window means formed therein between the mating end and the connector end, and means within said window means to reference said electrically conductive runners colinearly with respect to said printed conductors;
said conductive runners being made of deformable metal which, when bent, serves to maintain the shape of said bend; and
said thin flexible sheet being made of polymeric material and said printed circuit board having a ceramic substrate.

5. In the flexible circuit interconnect assembly of claim 1,
said thin flexible sheet including window means formed therein between the mating end and the connector end, and means within said window means to reference said electrically conductive runners colinearly with respect to said printed conductors;
said conductive runners being made of deformable metal which, when bent, serves to maintain the shape of said bend; and
said window means being an alignment slot in said sheet for visually observing when said runners are aligned colinearly of said printed conductors.

6. In the flexible circuit interconnect assembly of claim 1,
said thin flexible sheet including window means formed therein between the mating end and the connector end, and means within said window means to reference said electrically conductive runners colinearly with respect to said printed conductors;
said conductive runners being made of deformable metal which, when bent, serves to maintain the shape of said bend;
said thin flexible sheet being made of polymeric material and said printed circuit board having a ceramic substrate; and
said window means being an alignment slot in said sheet for visually observing when said runners are aligned colinearly of said printed conductors.

7. In the interconnect assembly of claim 1, said thin flexible sheet being made of polymeric material and said printed circuit board having a ceramic substrate.

8. In the interconnect assembly of claim 7, said thin flexible sheet having an alignment slot therethrough for visually observing when said runners are aligned colinearly of said printed conductors.

9. A method for assembling a connector assembly having round pin connectors thereon arranged in a fine pitch pattern and a circuit board having a connector side thereon with a plurality of printed conductors spaced at a similar fine pitch comprising the steps of:

providing a connector having a mating end and a connector end with a plurality of pin connectors each with a tail end;
providing a thin flexible sheet of electrically insulating material with a mating end, a connector end, and a plurality of electrically conductive runners on one side of the sheet;
prebending the thin flexible sheet into a self holding shape between the mating end thereof and the connector edge thereof so as to accomodate differential thermal expansion between the interconnected circuit components:
aligning the circuit board and the prebent thin flexible sheet to locate the electrically conductive runners thereon fully congruent with the printed conductors on the circuit board and in electrical contact therewith;
said aligning including providing a window at the connector end of the thin flexible sheet and extending each of the electrically conductive runners across the window to define reference lines for visually establishing congruent alignment of such runners with the printed conductor paths on the printed circuit board; placing the window over the printed conductors on the printed circuit board and relatively the printed circuit board and window until the runners and printed conductors are congruent with one another;
electrically connecting each of the aligned electrically conductive runners to separate ones of the printed conductors while the flexible sheet is so shaped;
assembling the mating end of the thin flexible sheet to the tail ends of the pin connectors by penetrating the tail ends through the mating end into electrical contact with respect to one of the electrically conductive runners; and
electrically bonding the distal end of each of the penetrated tail ends to one of the electrically conductive runners.

10. An interconnect assembly for electrically connecting a connector housing having pin connectors with tail ends thereon and a circuit board having a printed conductor pattern thereon and wherein the pin connectors and printed conductor patterns are interconnectable along one side of the circuit board at a fine pitch spacing therebetween the interconnect assembly comprising:
a thin flexible sheet of dielectric polymeric material having a mating end and a connector end;
means defining a plurality of holes directed through said thin sheet of flexible dielectric polymeric material along the mating edge thereof arranged at spacings corresponding to the fine pitch spacing of pin connectors on a connector housing and each of the plurality of holes adapted to receive the tail end of one of the plurality of pin connectors on the connector housing;
means defining a plurality of electrically conductive runners on one side of said thin flexible sheet, each of said electrically conductive runners having a thickness which permits bending thereof as said thin sheet is bent and each of said runners having a first end located at one of said plurality of holes and the other end thereof extending adjacent the connector end of said thin flexible sheet;
means for electrically connecting each of said tail ends to one of said electrically conductive runners at one end thereof and wherein the opposite end of each of said electrically conductive runners is adapted to overlie an end of a printed conductor path printed on a circuit board for electrical connection thereof; and said thin flexible sheet including window means formed therein between the mating end and the connector end, and means within said window to reference said electrically conductive runners co-linearly with respect to said printed conductors.

* * * * *